(12) United States Patent
Fuller

(10) Patent No.: US 9,450,430 B2
(45) Date of Patent: Sep. 20, 2016

(54) MOBILE DEVICE MOUNT WHICH IS WEARABLE OR MAY BE USED WITH A MOUNTING SYSTEM

(71) Applicant: Samuel Blake Fuller, Sarasota, FL (US)

(72) Inventor: Samuel Blake Fuller, Sarasota, FL (US)

( * ) Notice: Subject to any disclaimer, the term of this patent is extended or adjusted under 35 U.S.C. 154(b) by 29 days.

(21) Appl. No.: 14/216,184

(22) Filed: Mar. 17, 2014

(65) Prior Publication Data

US 2015/0264825 A1 Sep. 17, 2015

Related U.S. Application Data

(60) Provisional application No. 61/802,291, filed on Mar. 15, 2013.

(51) Int. Cl.
*A47G 29/00* (2006.01)
*H02J 7/00* (2006.01)
*F16B 2/22* (2006.01)
*F16M 13/04* (2006.01)
*G03B 17/56* (2006.01)
*H04M 1/11* (2006.01)
*H05K 5/02* (2006.01)
*H04M 1/04* (2006.01)

(52) U.S. Cl.
CPC .............. *H02J 7/0044* (2013.01); *F16B 2/22* (2013.01); *F16M 13/04* (2013.01); *G03B 17/561* (2013.01); *H04M 1/04* (2013.01); *H04M 1/11* (2013.01); *H05K 5/0204* (2013.01)

(58) Field of Classification Search
USPC ....... 248/682, 689, 690, 639, 674, 675, 452, 248/488, 115, 117.7, 310, 316.7, 316.8, 248/346.04, 905
See application file for complete search history.

(56) References Cited

U.S. PATENT DOCUMENTS

| | | | | |
|---|---|---|---|---|
| 2,185,084 A * | 12/1939 | Hutaff, Jr. | ............. | B60R 13/105 248/316.5 |
| 2,515,793 A * | 7/1950 | Owens | ................... | E01F 9/0117 248/126 |
| 2,579,878 A * | 12/1951 | Stone | ......................... | B25B 5/06 24/136 R |
| 2,679,121 A * | 5/1954 | Hoofer | ...................... | G06F 3/20 248/316.4 |
| 2,698,597 A * | 1/1955 | Buck | ........................ | H01J 29/18 118/503 |
| 2,873,082 A * | 2/1959 | Gillespie | ................. | F16B 2/241 248/300 |
| 2,895,702 A * | 7/1959 | Pierce | ................... | A47G 3/0241 248/285.1 |
| 2,924,809 A * | 2/1960 | Wilson | ..................... | H05K 7/12 165/69 |
| 3,182,807 A * | 5/1965 | Root | ...................... | H01C 10/40 211/49.1 |
| 4,566,865 A * | 1/1986 | Nishitsuji | ............. | F04B 39/127 248/300 |
| 4,614,322 A * | 9/1986 | Goetz | .................. | A47G 1/1646 24/528 |
| 6,068,222 A * | 5/2000 | Stangeland | ............. | D06F 79/02 248/117.7 |
| 8,074,951 B2 * | 12/2011 | Carnevali | ............... | B60R 11/02 108/143 |

(Continued)

*Primary Examiner* — Bradley Duckworth
(74) *Attorney, Agent, or Firm* — Mei & Mark LLP

(57) ABSTRACT

A mobile device mount includes a quadrilateral-shaped base plate having a pair of clamping sections at opposite corners. Each clamping section includes a pair of claws which extend away from the base plate, each claw ending in a gripper. The base plate may include several mounting features such as screw holes, channels, and twist-lock projections. The mobile device mount thereby provides convenient, secure, and versatile mounting for a mobile device.

20 Claims, 8 Drawing Sheets

(56) References Cited

U.S. PATENT DOCUMENTS

| | | | | |
|---|---|---|---|---|
| 8,091,850 B2* | 1/2012 | Carnevali | ............... | B25B 5/02 248/176.1 |
| 8,201,788 B2* | 6/2012 | Carnevali | ............. | F16B 5/0635 248/223.41 |
| 8,408,513 B2* | 4/2013 | Smith | ................... | A45C 13/30 224/258 |
| 8,702,055 B2* | 4/2014 | Alemozafar | ........... | F16M 13/00 248/688 |
| 8,720,844 B2* | 5/2014 | Westimayer | ........... | F16M 13/02 248/218.4 |
| 8,814,128 B2* | 8/2014 | Trinh | ...................... | A47F 7/024 248/187.1 |
| 8,821,044 B1* | 9/2014 | Dordick | ............... | G03B 17/561 248/176.3 |
| 2007/0246637 A1* | 10/2007 | Ju | ............................ | G06F 1/20 248/674 |
| 2010/0025444 A1* | 2/2010 | Tipton | ..................... | A45F 5/00 224/576 |
| 2011/0314712 A1* | 12/2011 | Cook | ................. | G06F 15/0018 40/584 |
| 2012/0080577 A1* | 4/2012 | McIntyre | ............. | F16M 11/041 248/346.04 |
| 2012/0170194 A1* | 7/2012 | Lord | ..................... | G06F 1/1632 361/679.02 |
| 2013/0105662 A1* | 5/2013 | Cote | ................... | F16M 11/041 348/689 |
| 2014/0042285 A1* | 2/2014 | Carnevali | ............... | B60R 11/02 248/316.4 |
| 2014/0077056 A1* | 3/2014 | Ghosh | .................. | F16M 11/041 248/690 |
| 2014/0245586 A1* | 9/2014 | Rojas | ....................... | A47G 1/12 29/428 |
| 2014/0250673 A1* | 9/2014 | White | ................ | A63B 71/0045 29/525.08 |
| 2014/0268622 A1* | 9/2014 | Chao | ....................... | B60R 11/02 361/809 |
| 2014/0347814 A1* | 11/2014 | Zaloom | ................. | G06F 1/1626 361/679.56 |
| 2015/0176759 A1* | 6/2015 | Morris | ................ | F16M 11/041 248/346.04 |

* cited by examiner

MOBILE DEVICE MOUNT WHICH IS WEARABLE OR MAY BE USED WITH A MOUNTING SYSTEM

CROSS-REFERENCE TO RELATED APPLICATION

This application claims the benefit of provisional application No. 61/802,291, filed Mar. 15, 2013, the entire contents of which are incorporated by reference herein.

BACKGROUND OF THE INVENTION

1. Field of the Invention

The present disclosure is directed generally to a mount. More specifically, the present disclosure is directed to a mobile device mount having good securement and a high degree of versatility.

2. Description of Related Art

The rate of technological advancement in mobile electronic devices is extremely fast. With each round of improvements, mobile electronic devices incorporate faster processors, larger screens, and more powerful internal components. Each of these improvements in turn causes the mobile electronic device to require a larger power supply.

Simultaneously, there exists an increased demand for the miniaturization of mobile electronic devices. As a result of the increased power requirements of mobile electronic devices, internal batteries now often account for the majority of a mobile electronic device's form factor. As such, there is a limit, based on the required battery specifications, as to how compact the mobile electronic device may become.

Further still, as the proliferation of mobile electronic devices continue, many consumers own multiple mobile devices for personal and business use. As such, a typical consumer is in constant proximity with mobile electronic devices which may need charging on demand or at unscheduled times, or may be in constant need for a convenient mounting system, especially a system which may be mounted without the use of tools.

To solve this problem, there exists a growing field of mobile charging devices which are separate from the mobile electronic devices themselves. However, current mobile charging device suffer from several disadvantages.

First, because current mobile charging devices are separate from the devices they are intended to charge, power cords and the like are required to connect the two devices. When the two devices are not held in a fixed arrangement to one another, this cord can cause tangles and/or damage to the devices.

Second, many current mounting devices are limited to only one mounting configuration. In this manner, a user's options are limited when it comes to mounting devices such as cameras and the like.

As such, there exists a need for a mobile device mount that provides secure retainment and a versatile range of mounting configurations.

BRIEF SUMMARY OF THE INVENTION

To solve the above problems, various aspects of the present disclosure include a base plate and first and second clamping sections to hold a mobile device therebetween.

Additionally, various aspects of the present disclosure include one or more mounting features to provide additional mounting configurations.

Additionally, various aspects of the present disclosure include a mobile device held by one or more mobile device mounts. Alternatively, various aspects of the present disclosure include multiple mobile devices held by a single mobile device mount.

DETAILED DESCRIPTION

Figure 1A:
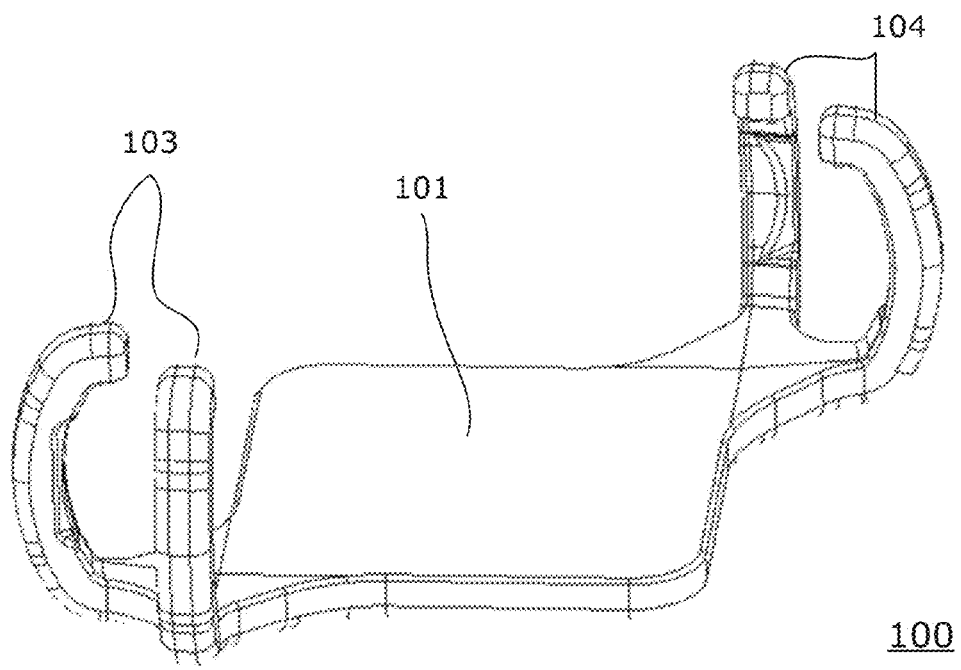
FIG. 1A is a top perspective view of an exemplary mobile device mount according to various aspects of the present disclosure.

In the following description, for purposes of explanation, numerous details are set forth, such as system configurations, to provide an understanding of one or more embodiments. However, it is and will be apparent to one skilled in the art that these specific details are not necessarily required to practice various aspects of the present disclosure.

A mobile device mount according to various aspects of the present disclosure is configured to allow for affixing a mobile device to a person or animal ("wearable" configurations) or an inanimate object ("mountable" configurations). Additionally or alternatively, a mobile device mount according to various aspects of the present disclosure is configured to affix inanimate objects to the mobile device.

In one aspect of the present disclosure, the mobile device mount may be configured to grasp a mobile device and thereby provide a mounting surface thereto.

In use, a mobile device mount is configured to attach to a mobile device (not shown). In one exemplary aspect of the present disclosure, the mobile device is a mobile Li-ion battery. In another exemplary aspect of the present disclosure, the mobile device may be a computing device, such as a cellular phone, a smartphone, a still camera, a video camera, a Global Positioning System (GPS) device, and the like. In general, the computing device may be any computing system and/or device that includes a processor and a memory. The computing device may employ any of a number of computer operating systems, including but not limited to versions and/or varieties of the Windows® operating system distributed by Microsoft Corp. of Redmond, Wash.; the Unix operating system (e.g., the Solaris® operating system distributed by Oracle Corporation of Redwood Shores, Calif.); the AIX UNIX operating system distributed by International Business Machines of Armonk, N.Y.; the Linux operating system; the Mac OS X and iOS operating systems distributed by Apple Inc. of Cupertino, Calif.; the BlackBerry OS distributed by Research In Motion of Waterloo, Canada; and the Android operating system developed by the Open Handset Alliance. Preferably, the mobile device has a form factor of a substantially rectangular prism.

One example of a mounting arrangement for the mobile device may be an arrangement comprising a pair of mobile device mounts configured to jointly encompass the mobile device while permitting access to any ports disposed in a side surface of the mobile device.

In this configuration, the bottom mobile device mount may be configured to mount into existing or custom mounting systems, whereas the top mobile device mount may be configured to mount into existing or custom mounting cradles for a second mobile device. For example, the pair of mobile device mounts may jointly encompass a mobile Li-ion battery, and the top mobile device mount may further be configured to mount a camera powered by the mobile Li-ion battery.

Additionally or alternatively, in this configuration, the jointly-encompassed mobile device may be disposed to "interrupt" existing or custom mounting systems for devices; for example, an existing or custom mounting system for the second mobile device may be instead attached to the bottom mobile device mount.

In order to provide sufficient securement of the mobile device, the mobile device mount is appropriately dimensioned to match the outer dimensions of the mobile device as will be described in more detail below.

FIGS. 1A-3 illustrate an exemplary mobile device mount 100 according to various aspects of the present disclosure.

Figure 1B:
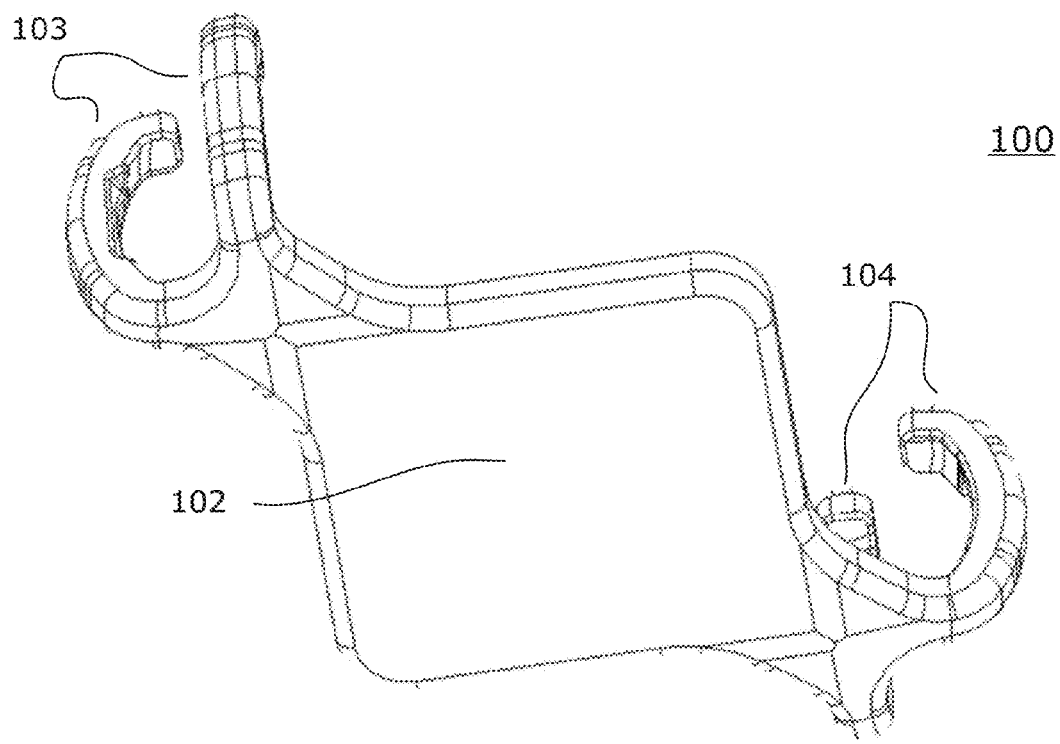
FIG. 1B is bottom perspective view of the exemplary mobile device mount of FIG. 1A.
Figure 2A:
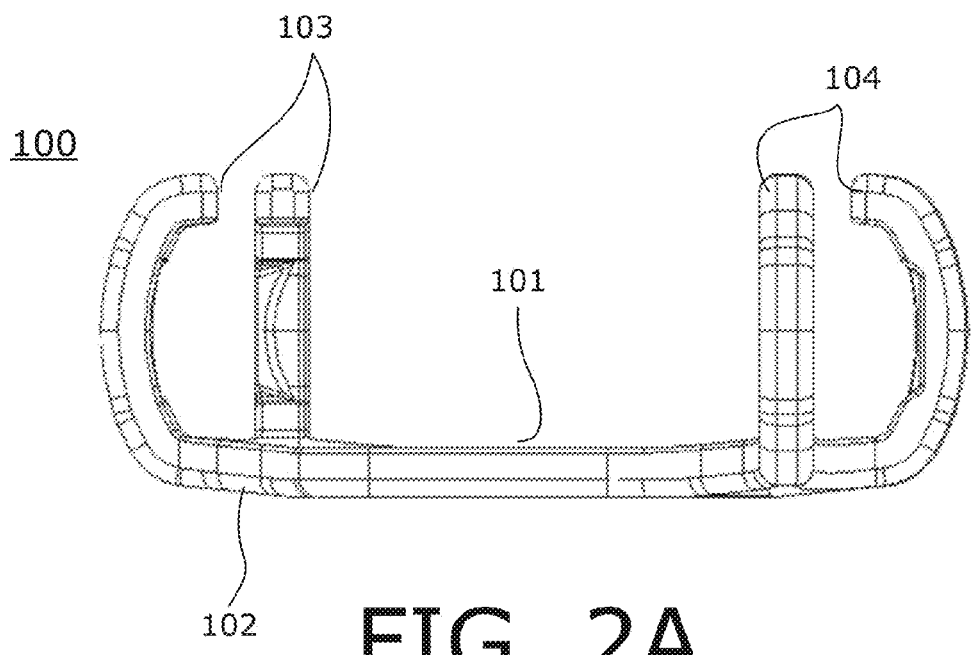
FIG. 2A is a side view of the exemplary mobile device mount of FIGS. 1A-B.
Figure 2B:
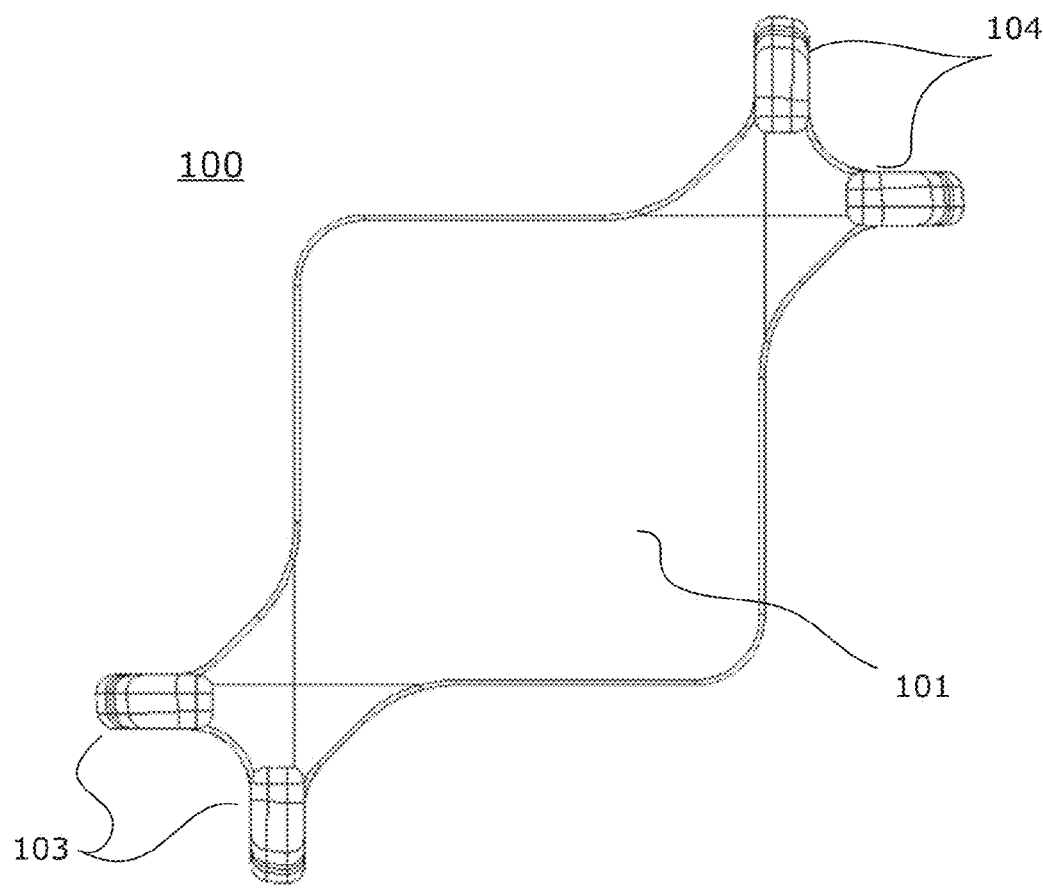
FIG. 2B is a top view of the exemplary mobile device mount of FIGS. 1A-B.

FIG. 1A shows a top perspective view of the exemplary mobile device mount 100, FIG. 1B shows a bottom perspective view thereof, FIG. 2A shows a side view thereof, and FIG. 2B shows a top view thereof. Mobile device mount 100 includes a quadrilateral base plate having an abutment surface 101 and a mounting surface 102, a first clamping section 103, and a second clamping section 104. Preferably, mobile device mount 100 has a unitary construction formed by, for example, injection molding.

Mobile device mount 100 is preferably formed from a material having high resilience, high shear and tensile strengths, and good deflection, while retaining sufficient flexibility to allow the mobile device mount 100 to snap onto a mobile device. Most preferably, mobile device mount 100 is formed from a plastic such as polycarbonate/acrylonitrile butadiene styrene ("PC/ABS") or poly(hexane-6-lactam) ("PA6").

Abutment surface 101 and mounting surface 102 are respectively disposed as opposite surfaces of the base plate. In use, abutment surface 101 is configured to at least partly abut a surface of a mobile device being held, such as a mobile device of the type described above. Furthermore, mounting surface 102 is configured to provide a support surface for an external device, such as a second mobile device of the type described above. In this aspect of the present disclosure, abutment surface 101 and mounting surface 102 are substantially planar. Alternatively, if the mobile device to which mobile device mount 100 is configured has a slightly convex surface, abutment surface 101 may provide a matching concave surface. Additionally, mounting surface 102 may be configured with a frictional subsurface thereof. In this manner, mounting surface 102 may prevent rotation in an object in contact therewith.

The first and second clamping sections 103, 104 are respectively disposed at a first corner and a second corner of the base plate, where the first corner and the second corner are disposed opposite one another. In use, the first and second clamping sections 103, 104 respectively clamp a corresponding first corner and second corner of a mobile device. As such, mobile device mount 100 is preferably configured such that a distance between the first clamping section 103 and the second clamping section 104 is matched to a diagonal dimension of the mobile device. First and second clamping sections 103, 104 respectively extend away from the base plate in a direction perpendicular to the plane of the base plate.

As illustrated in FIGS. 2A-B, each of first and second clamping sections 103, 104 are respectively configured to clamp on two surfaces of a held device near the corner thereof. In this manner, mobile device mount 100 can provide a secure grip on all four side surfaces of a rectangular-prism-shaped mobile device while having a small footprint. In other words, each clamping section 103, 104 respectively provides for grip on both axes of the plane of the base plate.

Figure 3:
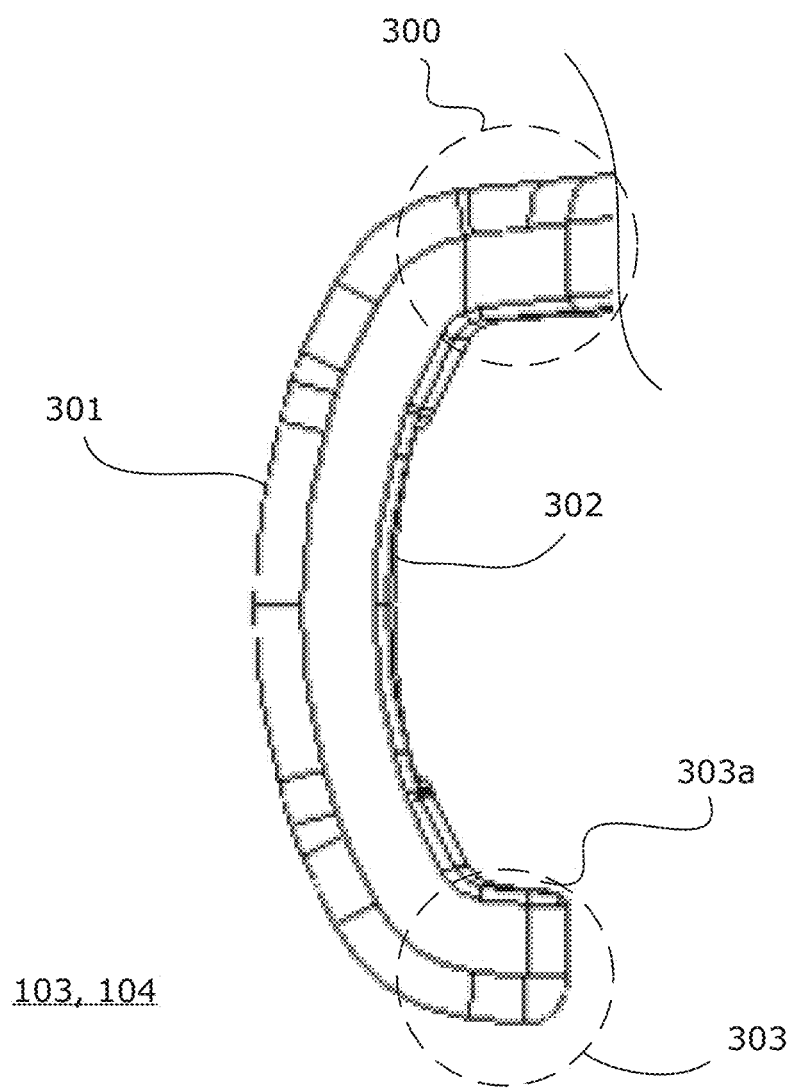
FIG. 3 is partial view of the exemplary mobile device mount of FIGS. 1A-B.

FIG. 3 shows a detailed view of an exemplary clamping section, such as first clamping section 103 or second clamping section 104. Exemplary clamping section 103, 104 includes a proximate portion 300 disposed at a corner of the base plate and a distal portion 303 disposed a distance from the base plate, a claw having an outer surface 301 and an inner surface 302 extending therebetween. Although FIG. 3 illustrates outer surface 301 as a convex surface and inner surface 302 as a concave surface, one or both of surfaces 301, 302 may alternatively have a planar shape. In either configuration, respective corners between outer surface 301, the proximate portion 300, and the distal portion 303 are rounded. Preferably, the claws are reinforced so as to transfer torque to the base plate.

Clamping section 103, 104 terminates at the distal portion 303 with a gripper 303a. Gripper 303a extends substantially perpendicularly to outer surface 301 and inner surface 302, and in a direction parallel to a plane of the base plate of mobile device mount 100. In this manner, the surface of gripper 303a provides a frictional clamping on an outer surface of a mobile device held by mobile device mount 100. As such, in coordination with abutment surface 101 and inner surface 302, gripper 303a allows for secure contact with a rectangular prism-shaped-device on all six surfaces thereof.

Preferably, each clamping section 103, 104 respectively includes a single proximate section and a pair of claws extending perpendicular to both the base plate and one another, each claw terminating at a gripper.

Preferably, the frictional clamping provided by clamping sections 103, 104 is sufficient to withstand pulling forces of greater than fifty times the weight of the mobile device being clamped.

Figure 4:
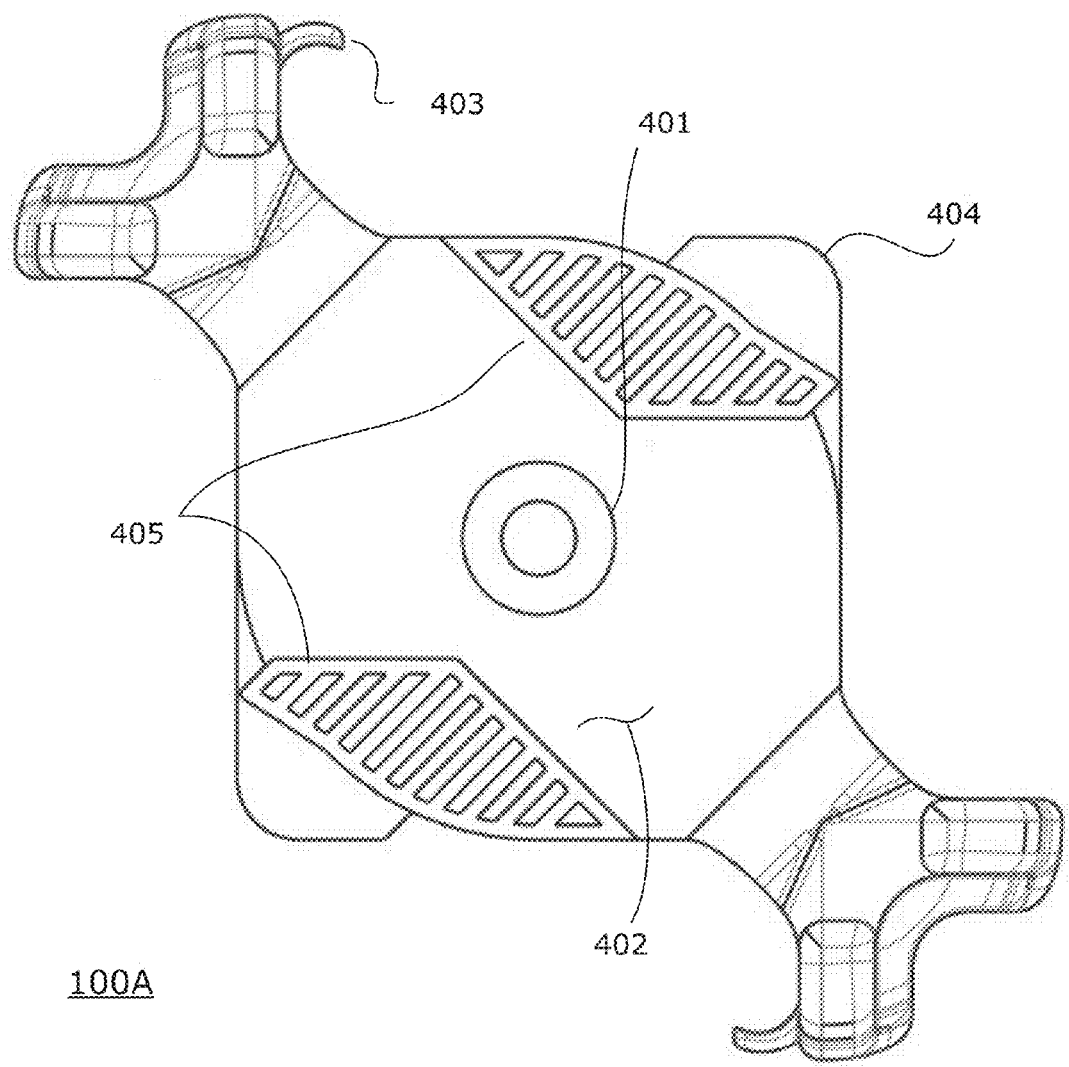
FIG. 4 is a top view of a second exemplary mobile device mount according to various aspects of the present disclosure.

FIG. 4 illustrates a second exemplary mobile device mount 100A according to a second aspect of the present disclosure. For clarity of disclosure, those elements of second exemplary mobile device mount 100A which are substantially similar to mobile device mount 100 are not expressly labeled in FIG. 4. Similar to mobile device mount 100, mobile device mount 100A includes a base plate having an abutment surface 101 and a mounting surface 102, a first clamping section 103, and a second clamping section 104.

Mobile device mount 100A further includes a plurality of mounting features such as a through-hole 401, a channel 402, a retention tab 403, a twist-lock projection 404, and ridges 405. Although FIG. 4 illustrates exemplary mobile device mount 100A as including all of the above mounting features, mobile device mount 100A (and/or mobile device mount 100) may include fewer or additional mounting features.

Through-hole 401 passes from abutment surface 101 to mounting surface 102. Preferably, the diameter of through-hole 401 at abutment surface 101 is larger than the diameter of through-hole 401 at mounting surface 102. Furthermore, the diameter of the through-hole 401 at mounting surface 102 is preferably about 0.25 in. In this manner, through-hole 401 can accommodate a standard ¼-20 screw (or another common mounting screw) such that the screw head remains flush with abutment surface 101.

Channel 402 is a recessed surface portion of abutment surface 101. Preferably, a width of channel 401 is at least 0.75 in and a depth of channel 401 is less than 0.125 in. Channel 402 extends from a first edge of the base plate to a second edge opposite the first edge. In this manner, channel 402 can accommodate a strap, a belt, a cord, a wristband, and the like. As illustrated in FIG. 4, exemplary mobile device mount 100A preferably has two channels, where a first channel runs in a direction from the first clamping section to the second clamping section and a second channel runs in a direction perpendicular to a side surface of the base plate.

Retention tab 403 extends from at least one claw of the clamping sections 103, 104 in a direction perpendicular thereto (that is, parallel to the base plane). Retention tab 403 has a substantially concave inner surface. In use, retention tab 403 is configured to securely hold a cord (such as a power cord or a USB cord) in place between the concave inner surface and an outer surface of a held mobile device. In this manner, retention tab 403 may provide a secure hold and relieve tension on a held cord. As illustrated in FIG. 4, exemplary mobile device mount 100A preferably has two retention tabs disposed opposite one another.

Twist-lock projection 404 extends from the base plate in a direction parallel to a plane of the base plate, and preferably has the same or a smaller thickness than a thickness of the base plate. In this manner, twist-lock projection 404 allows the mobile device mount 100A to be securely attached to accessory plates having a female twist-lock adaptor. Examples of such accessory plates include wall chargers (such as a wall charger of the type described in more detail below), two-prong adaptors for an existing mount system (such as a GoPro® mount system), three-prong adaptors for a camera (such as a GoPro® camera), belt clips, RAM mounts, tripod mounts, suction mounts, push-pull pin clamps for insertion into flat surfaces, wraps, or ties for cylindrical surfaces. As illustrated in FIG. 4, exemplary mobile device mount 100A preferably has two twist-lock projections disposed opposite one another.

Ridges 405 extend along channels 402 and, in combination therewith, provide abutment surface 101. Ridges 405 are configured to provide friction to either a held mobile device or to any intervening element, such as a strap or belt. In this manner, ridges 405 may work in tandem with channels 402 to provide slidable engagement in a first direction, but secure engagement in a second direction perpendicular to the first direction.

Figure 5:
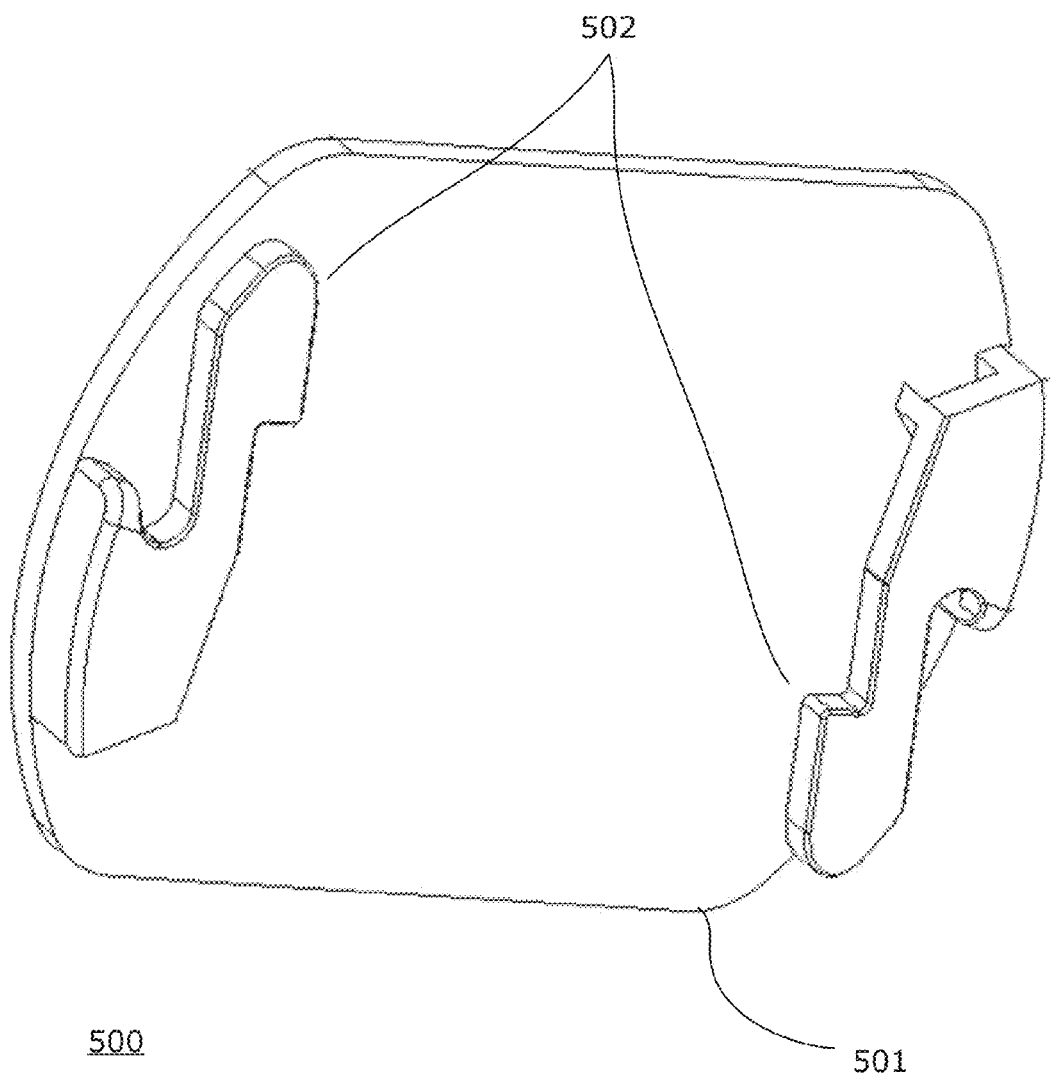
FIG. 5 is a perspective view of a third exemplary mobile device mount according to various aspects of the present disclosure.

FIG. 5 illustrates a secondary mount 500 to be used with mobile device mount 100A. Specifically, secondary mount comprises a secondary plate 501 and a pair of female twist-lock adaptors 502. Secondary mount 500 is configured to be engaged with mobile device mount 100A via a rotatable mating between twist-lock projections 404 and female twist-lock adaptors 502. Secondary mount 500 may be configured to provide a secondary mount surface as described above. Additionally, secondary plate 501 may be further configured with a second pair of female twist-lock adaptors 502 on an opposite face thereof.

Figure 6A:
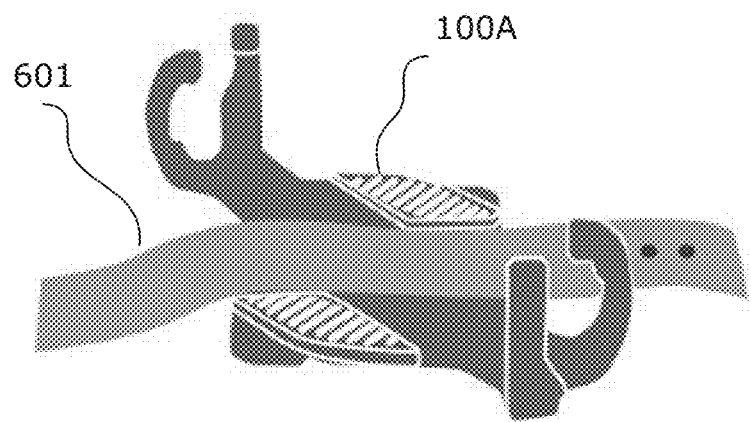
FIG. 6A is a first exemplary mounting configuration according to various aspects of the present disclosure.
Figure 6B:
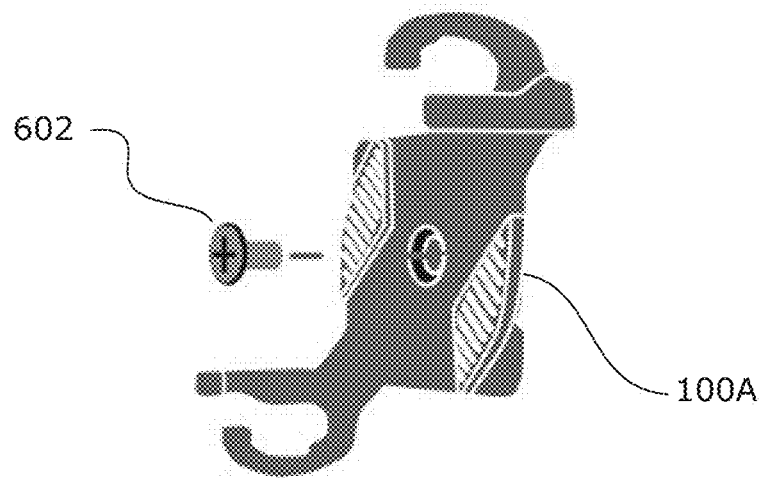
FIG. 6B is a second exemplary mounting configuration according to various aspects of the present disclosure.

FIGS. 6A-B illustrate first and second mounting configurations for mobile device mount 100A. Specifically, FIG. 6A illustrates a configuration wherein mobile device mount 100A is configured to receive a strap 601 (such as a belt, a backpack strap, or any other flexible attachment surface) through channel 402. FIG. 6B illustrates a configuration wherein mobile device mount 100A is configured to receive a fastener 602 (such as a screw) in through-hole 401. In this manner, FIGS. 6A-B illustrate exemplary means by which mobile device mount 100A may be mounted to a surface, a person, or any other animate or inanimate object.

Figure 7:
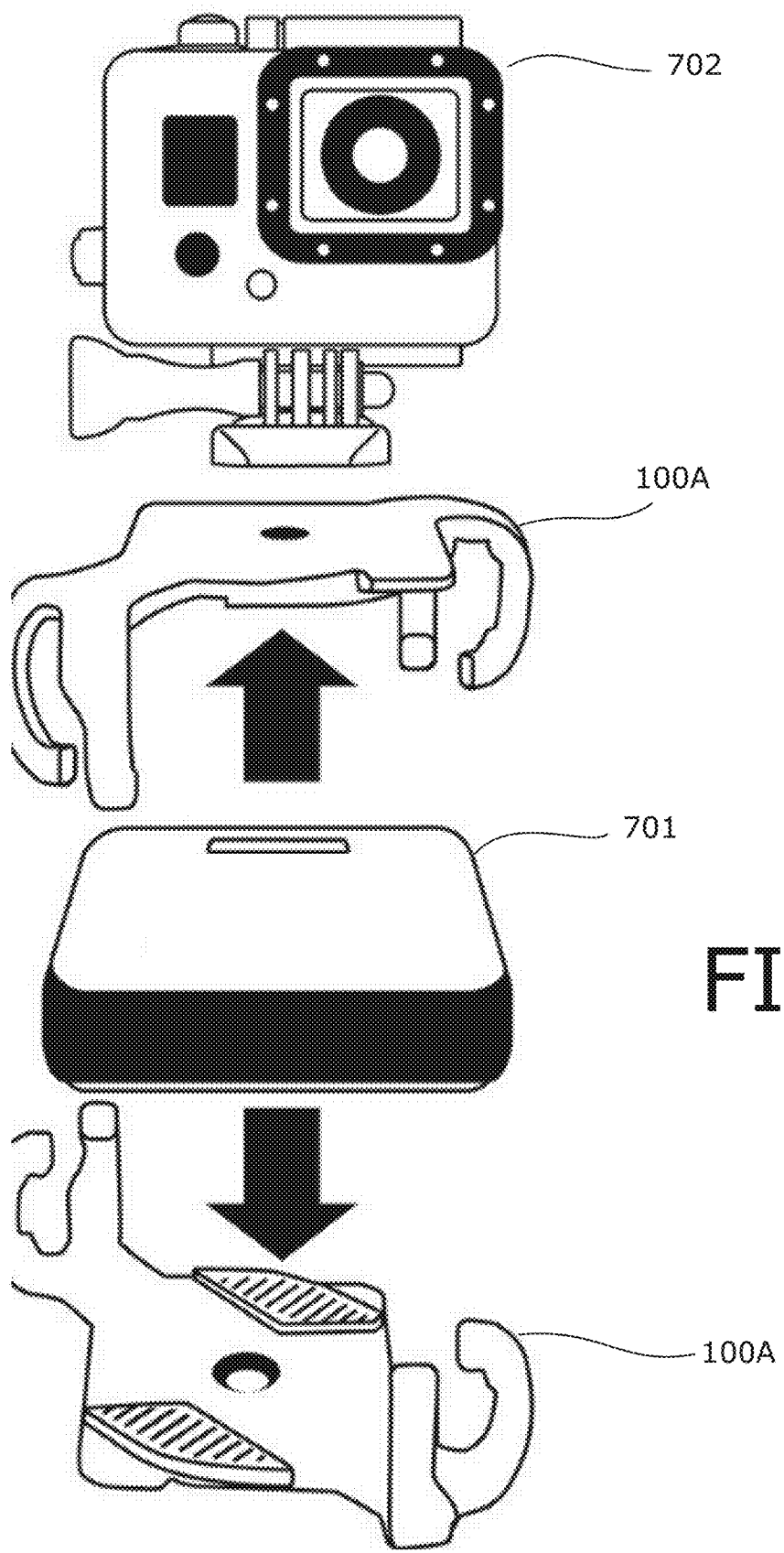
FIG. 7 illustrates an exemplary dual-mounting configuration according to various aspects of the present disclosure.

FIG. 7 illustrates a usage example. Specifically, FIG. 7 illustrates a first mobile device 701 (such as a portable battery) being encompassed by a pair of mobile device mounts 100A. Upper mobile device mount 100A is configured to attach the first mobile device 701 to a second mobile device 702 (such as a portable camera). Second mobile device 702 may preferably be attached to upper mobile device mount 100A by mounting features such as features 401-404 described above.

Figure 8:
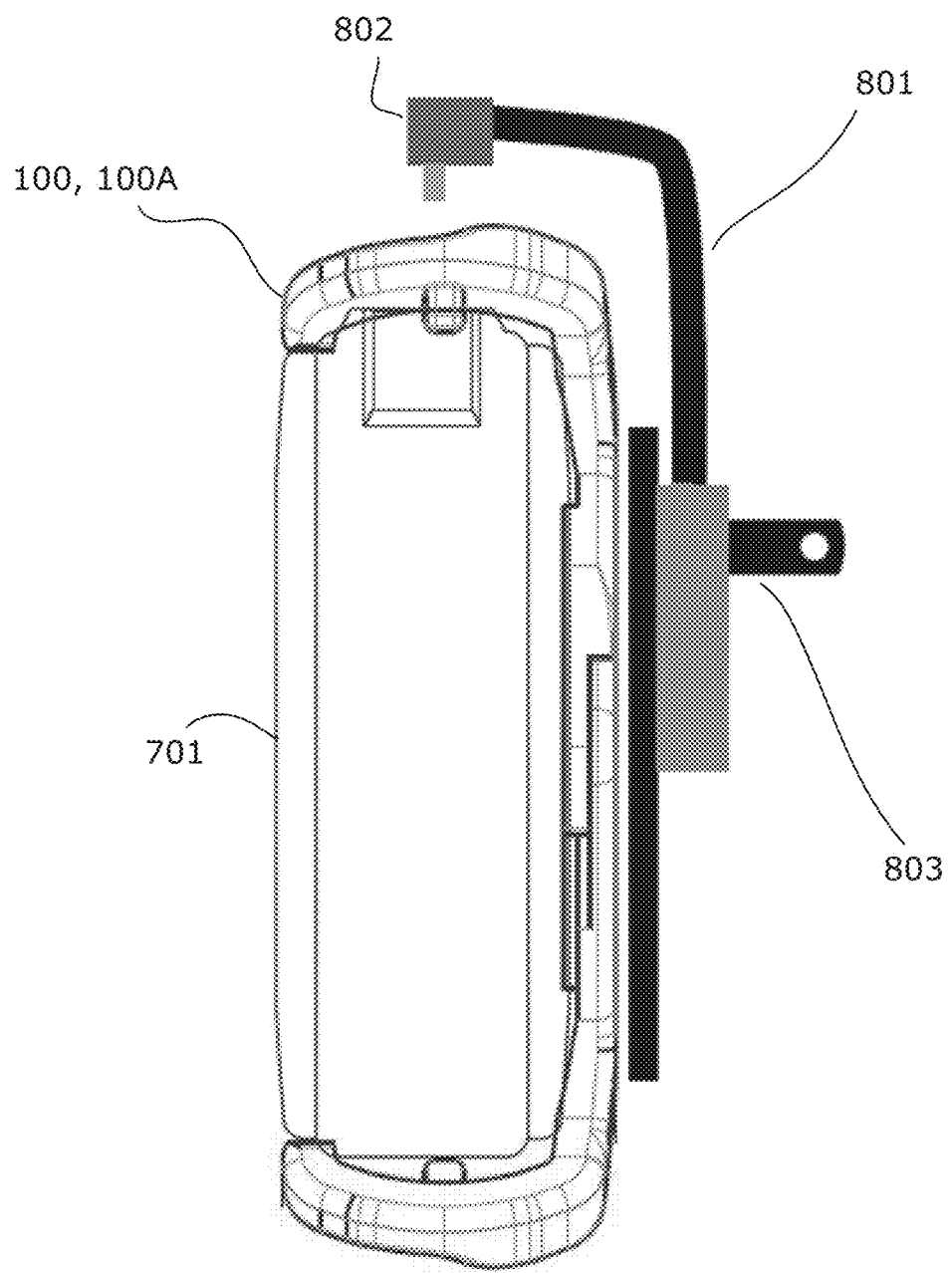
FIG. 8 illustrates an exemplary wall charger configuration according to various aspects of the present disclosure.

FIG. 8 illustrates an exemplary wall charger configuration for exemplary mobile device mount 100 (or 100A). FIG. 8 illustrates a mobile device mount 100, 100A attached to a mobile device 701 (such as the portable battery described above with regard to FIG. 7). On a mounting surface 102 of mobile device mount 100, 100A, a wall charger 801 is provided. Wall charger may preferably be attached to mobile device mount 100A by mounting features such as features 401-404 described above.

Wall charger 801 includes a frame, a device plug 802, and a wall plug 803. Device plug 802 is configured to engage with the held mobile device 701 to provide charging power thereto. As particularly illustrated in FIG. 8, wall plug 803 is a standard two-prong adaptor; however, other types of wall plugs may be provided to adapt to other countries and/or power sources.

Although not expressly illustrated, various aspects of the present disclosure include other mounting configurations as described below.

In a bicycle mount configuration, a clamp may be employed around a head tube or a seat tube to encompass one of the tubes, and a mobile device mount may be attached thereto to hold a mobile device in place. Similarly, this type of clamping may be applied to roll cages, handlebars, or any tubular component such as a vehicle part, sports equipment, commercial equipment, and/or industrial equipment.

In a RAM mount configuration, mobile device mount may be configured to hold and/or attach to a motorbike RAM mount. Additionally or alternatively, multiple mobile device mounts 100 may be provided so that a first mobile device mount is mounted to the RAM mount, and a second mobile device mount has a mounting surface which provides a second RAM mount for mounting additional mobile devices.

In a cupholder mount configuration, mobile device mount may be dimensioned so as to fit into an automobile cupholder.

In a camera mount configuration, a mobile device mount may be configured to provide mounting surface 102 for direct mounting of a camera, such as a GoPro® Camera, or a preexisting mounting kit system therefor.

In a vacuum mount configuration, a mobile device mount may be configured with a suction cup or the like to provide for mounting to a variety of surfaces regardless of surface orientation. In this manner, the mobile device mount may be configured for a variety of different devices, including cellular phones or other electronic items having a flat surface.

With regard to any processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The invention claimed is:

1. A mobile device mount, comprising:
   a base plate including an abutment face and a mounting face;
   a first clamping section, including
      a first proximate section disposed at a first corner of the base plate,
      a first pair of claws extending from the first proximate section in a first direction, the first direction being perpendicular to the base plate, and
      a first pair of grippers respectively disposed at a distal end of the first pair of claws and extending in a second direction and a third direction, respectively, the second and third directions being parallel to the base plate; and
   a second clamping section, including
      a second proximate section disposed at a second corner of the base plate, the second corner being located opposite the first corner,
      a second pair of claws extending from a second corner of the base plate in the first direction, and
      a second pair of grippers respectively disposed at a distal end of the second pair of claws and extending in a fourth direction and fifth direction, respectively, the fourth and fifth directions being parallel to the base plate,
   wherein:
      a length of each of the first pair of claws in the first direction is greater than a width and a depth of each of the first pair of claws;
      the length of each of the first pair of claws in the first direction is greater than a length of each of the first pair of grippers in the respective second and third directions, respectively;
      a length of each of the second pair of claws in the first direction is greater than a width and a depth of each of the second pair of claws; and
      the length of each of the second pair of claws in the first direction is greater than a length of each of the second pair of grippers in the respective third and fourth directions, respectively.

2. The mobile device mount according to claim 1, wherein the base plate includes a screw hole at a center portion thereof.

3. The mobile device mount according to claim 2, wherein the screw hole has a diameter of 0.25in.

4. The mobile device mount according to claim 2, wherein a diameter of the screw hole at the abutment surface is larger than a diameter of the screw hole at the mounting surface.

5. The mobile device mount according to claim 1, wherein the abutment face of the base plate includes a channel with a width of at least 0.75 inches.

6. The mobile device mount according to claim 1, where a claw of the first pair of claws further includes a retention tab on a side surface thereof.

7. The mobile device mount according to claim 1, wherein the base plate includes a twist-lock projection.

8. The mobile device mount according to claim 1, wherein the mobile device mount is formed of a material selected from the group including polycarbonate/acrylonitrile butadiene styrene and poly (hexane-6-lactam).

9. The mobile device mount of claim 1, wherein the base plate has a substantially quadrilateral shape.

10. The mobile device mount of claim 9, wherein the baseplate has a substantially square shape.

11. The mobile device mount of claim 1, wherein at least the first clamping section, the second clamping section, and the baseplate are of a unitary construction.

12. A mounted mobile device, comprising:
   a mobile device; and
   a mobile device mount, the mobile device mount including:
      a base plate including an abutment face and a mounting face;
      a first clamping section, including
         a first proximate section disposed at a first corner of the base plate, a first pair of claws extending from the first proximate section in a first direction, the first direction being perpendicular to the base plate, and a first pair of grippers respectively disposed at a distal end of the first pair of claws and extending in a second direction and a third direction, respectively, the second and third directions being parallel to the base plate; and a second clamping section, including a second proximate section disposed at a second corner of the base plate, the second corner being located opposite the first corner, a second pair of claws extending from a second corner of the base plate in the first direction, and a second pair of grippers respectively disposed at a distal end of the second pair of claws and extending in a fourth direction and fifth direction, respectively, the fourth and fifth directions being parallel to the base plate, wherein:

a length of each of the first pair of claws in the first direction is greater than a width and a depth of each of the first pair of claws;

the length of each of the first pair of claws in the first direction is greater than a length of each of the first pair of grippers in the respective second and third directions, respectively;

a length of each of the second pair of claws in the first direction is greater than a width and a depth of each of the second pair of claws; and the length of each of the second pair of claws in the first direction is greater than a length of each of the second pair of grippers in the respective third and fourth directions, respectively.

13. The mounted mobile device according to claim 12, wherein the mobile device is a mobile phone.

14. The mounted mobile device according to claim 12, wherein the mobile device is a mobile battery.

15. The mounted mobile device according to claim 12, wherein the mobile device is a camera.

16. The mobile device mount of claim 12, wherein the base plate has a substantially quadrilateral shape.

17. The mobile device mount of claim 12, wherein the baseplate has a substantially square shape.

18. The mobile device mount of claim 12, wherein at least the first clamping section, the second clamping section, and the baseplate are of a unitary construction.

19. A mounted mobile device, comprising:

a mobile device;

a first mobile device mount on a first face of the mobile device; and a second mobile device mount on a second face of the mobile device, the second face opposite the first face, wherein the first and second mobile device mount respectively comprise:

a base plate including an abutment face and a mounting face;

a first clamping section, including a first proximate section disposed at a first corner of the base plate, a first pair of claws extending from the first proximate section in a first direction, the first direction being perpendicular to the base plate, and a first pair of grippers respectively disposed at a distal end of the first pair of claws and extending in a second direction and a third direction, respectively, the second and third directions being parallel to the base plate; and a second clamping section, including a second proximate section disposed at a second corner of the base plate, the second corner being located opposite the first corner, a second pair of claws extending from a second corner of the base plate in the first direction, and a second pair of grippers respectively disposed at a distal end of the second pair of claws and extending in a fourth direction and fifth direction, respectively, the fourth and fifth directions being parallel to the base plate, wherein:

a length of each of the first pair of claws in the first direction is greater than a width and a depth of each of the first pair of claws;

the length of each of the first pair of claws in the first direction is greater than a length of each of the first pair of grippers in the respective second and third directions, respectively;

a length of each of the second pair of claws in the first direction is greater than a width and a depth of each of the second pair of claws; and the length of each of the second pair of claws in the first direction is greater than a length of each of the second pair of grippers in the respective third and fourth directions, respectively.

20. The mobile device mount of claim 19, wherein at least the first clamping section, the second clamping section, and the baseplate are of a unitary construction.

* * * * *